United States Patent [19]

Inoue

[11] Patent Number: 5,305,278
[45] Date of Patent: Apr. 19, 1994

[54] SEMICONDUCTOR MEMORY DEVICE HAVING BLOCK WRITE FUNCTION

[75] Inventor: Kazunari Inoue, Hyogo, Japan

[73] Assignee: Mitsubishi Denki Kabushiki Kaisha, Tokyo, Japan

[21] Appl. No.: 801,809

[22] Filed: Dec. 6, 1991

[30] Foreign Application Priority Data

Dec. 18, 1990 [JP] Japan .................................. 2-403380

[51] Int. Cl.$^5$ .................................................. G11C 7/00
[52] U.S. Cl. ........................... 365/230.03; 365/189.01; 365/189.05
[58] Field of Search ...................... 365/230.03, 189.05, 365/189.01, 900

[56] References Cited

U.S. PATENT DOCUMENTS

| | | | |
|---|---|---|---|
| 4,636,986 | 1/1987 | Pinkham | 365/195 |
| 4,639,890 | 1/1987 | Heilveil et al. | 365/189 X |
| 4,689,741 | 8/1987 | Redwine et al. | 365/189 X |
| 4,874,692 | 11/1989 | Tokushige | 365/230.03 |
| 4,897,818 | 1/1990 | Redwine et al. | 365/221 |
| 4,926,385 | 5/1990 | Fujishima | 365/230.03 |
| 5,003,510 | 3/1991 | Kamisaki | 365/189.01 |
| 5,140,553 | 8/1992 | Choi et al. | 365/218 |

OTHER PUBLICATIONS

Ray Pinkham et al, "A 128KX8 70-MHz Multiport Video RAM with Auto Register Reload and 8X4 Block Write Feature", IEEE Journal of Solid-State Circuits, vol. 23, No. 5, Oct. 1988.

Primary Examiner—Eugene R. LaRoche
Assistant Examiner—Christopher R. Glembocki
Attorney, Agent, or Firm—Lowe, Price, LeBlanc & Becker

[57] ABSTRACT

A color data transferring circuit, a color data storing circuit, and a block selecting circuit 1020 are provided separately from an input/output buffer circuit, in order to transmit data stored in a color register to a memory cell block. In a block write mode, data applied to a data input/output terminal is stored in the color data storing circuit through color register and the color data transferring circuit. One block selecting gate is selected in response to a block selecting signal from a block decoder, and data stored in each storage element in the color data storing circuit is transmitted to a corresponding memory cell block. Input/output buffer circuit performs normal data writing only through a sense amplifier +I/O block. A semiconductor memory device capable of easily extending the number of bits of block write with a simple circuit configuration is implemented.

14 Claims, 10 Drawing Sheets

BLOCK WRITE CYCLE

BLOCK WRITE CYCLE

SEMICONDUCTOR MEMORY DEVICE HAVING BLOCK WRITE FUNCTION

BACKGROUND OF THE INVENTION

1. Field of the Invention

The present invention relates generally to semiconductor memory devices, and, more particularly, to a semiconductor memory device having a block write function of writing data into a plurality of bits on the same row in one memory cycle. The present invention relates more particularly to improvements in a block write scheme in a multiport RAM with a RAM (random access memory) port accessible in a random sequence and a SAM (serial access memory) port accessible only sequentially.

2. Description of the Background Art

Image information is processed digitally in a work station, a personal computer, and the like. In order to display such image information on a display unit, a frame buffer memory referred to as a video RAM is employed. One line of a video RAM corresponds to a horizontal scan line on a screen of a display unit. A frame buffer stores image data of one frame. A general RAM cannot perform writing and reading of data simultaneously. Accordingly, in a case in which a general RAM is used as a video RAM, a CPU (central operation processing unit) cannot access the video RAM in a period of displaying pixel data. The CPU access the video RAM only in a horizontal blanking period. This reduces the data processing speed of the system. Accordingly, a multiport RAM capable of performing outputting of pixel data therefrom to a display unit and being accessed by a CPU simultaneously and asynchronously is widely used as an image processing memory in general.

FIG. 1 is a schematic diagram of a structure of an image processing system employing a multiport RAM. Referring to FIG. 1, the processing system includes a multiport RAM 900 as a video RAM for a frame buffer. Multiport RAM 900 includes a dynamic memory cell array 901 accessible in a random sequence and a serial access register 902 accessible only serially. Generally, the part including dynamic memory cell array 901 is referred to as a RAM port, and the part including serial access register 902 is referred to as a SAM port. Serial access register 902 is capable of storing data of one row in dynamic memory cell array 901.

The image processing system further includes a CPU 910 for accessing multiport RAM 900 in a random sequence and performing required processing, a display device 930 for displaying pixel data provided from serial access resistor 902, and a CRT display controller 920 for generating a control signal for controlling operation of the video RAM.

The multiport RAM 900 transfers pixel data of one row at a time from the RAM port to the SAM port. In the period of serially providing the pixel data of one row to display unit 930, CPU 910 can randomly access the RAM port and execute required processing. Accordingly, if the data transfer from the RAM port to the SAM port is performed in a horizontal blanking period, CPU 910 is capable of randomly reading the contents of dynamic memory cell array 901, performing required processing on the read data, and then writing the processed data into dynamic memory cell array 901 again in the remaining horizontal scan period.

Operation timings of multiport RAM 900 are controlled by CRT display controller 920, and CPU 910 is forbidden to make access during data transfer from the RAM port to the SAM port. If such multiport RAM 900 is employed as a video RAM for a frame buffer, CPU 910 is capable of making access to the multiport RAM in parallel with displaying on display unit 930, so that the processing speed of the system is greatly improved.

FIG. 2 is a diagram illustrating an example of the whole structure of a multiport RAM. The multiport RAM illustrated in FIG. 2 includes a RAM port which is randomly accessible and a SAM port which is only serially accessible, so that it will be described as a dual port RAM in the following description. While inputting/outputting of data is generally performed in a plurality of bits, for example, in four bits or in eight bits in a dual port RAM, a structure in which inputting/outputting of data is performed in one bit is illustrated in FIG. 2.

Referring to FIG. 2, a dual port RAM 100 includes a randomly accessible random access memory cell array 1. Random access memory cell array 1 includes a plurality of memory cells MC arranged in a matrix of rows and columns. Dual port RAM 100 further includes an address buffer circuit 7 receiving an external address A0 - An applied to an address input terminals 20 for generating an internal address, a row decoder 2 responsive to an internal row address from address buffer circuit 7 for selecting a corresponding row in random access memory cell array 1, a column decoder 3 responsive to an internal column address from address buffer circuit 7 for generating a column selecting signal for selecting a column in random access memory cell array 1, a sense amplifier for sensing and amplifying data in memory cells in the selected one row in random access memory cell array 1, and an I/O gate responsive to the column selecting signal from column decoder 3 for connecting the selected column in random access memory cell array 1 to a RAM input/output buffer circuit 4. The sense amplifier and the I/O gate are illustrated as one block 5 in FIG. 2.

In data reading, RAM input/output buffer circuit 4 generates an external read data from data on a common data bus 105 to an external data input/output terminal 22. In data writing, RAM input/output buffer circuit 4 generates onto common data bus 105 an internal write data from an external write data WIOi applied to external data input/output terminal 22.

Dual port RAM 100 further includes a color register 200 for storing data for performing flash write or block write. The transfer of data stored in color register 200 onto common data bus 105 is performed through RAM input/output buffer circuit 4. Flash write and block write will be described later. The part related to inputting/outputting of data through data input/output terminal 22 is referred to as a RAM port.

Dual port RAM 100 further includes a serial memory cell array 11 accessible only serially, a transfer gate 10 for performing data transfer between serial memory cell array 11 and one row in random access memory array 1, a serial selector 12 for sequentially selecting a memory cell in serial memory cell array 11, and a SAM input/output buffer circuit 14 for connecting common data bus 15 and a data input/output terminal 32. In data reading, SAM input/output buffer circuit 14 generates an external read data from data on common data bus 15 and applies it to data input/output terminal 32. In data writing, SAM input/output buffer circuit 14 generates an internal write data from an external write data SIOi applied to data input/output terminal 32 and transmits it to common data bus 15. Serial memory cell array 11 has a capacity capable of storing data of at least one row in random access memory cell array 1.

Dual port RAM 100 further includes, as peripheral circuits, an internal clock generating circuit 8 receiving external control signals *RAS, *CAS, *WB/*WE, *DT/*OE, and DSF applied to an external clock input terminal 21 and generating various internal control signals, a SC buffer circuit 17 receiving a clock signal SC applied to a control signal input terminal 30 and generating an internal clock signal, a SE buffer circuit 18 receiving a control signal *SE applied to an input terminal 31 and generating an internal control signal for activating the SAM port, a QSF buffer circuit 19 responsive to the internal clock signal from SC buffer circuit 17 for applying an external control signal QSF to an output terminal 33, and a signal converting circuit 16 implemented with a counter circuit, for example, responsive to the internal clock signal from SC buffer circuit 17 for converting it to a signal shifting the activation position of serial selector 12 one by one.

Control signal *RAS is a row address strobe signal for giving timing in which address buffer circuit 7 strobes an address A0 - An applied to address input terminals 20 as a row address and controlling operation of row selection circuitry in the RAM port. Control signal *CAS is a column address strobe signal for giving timing in which address buffer circuit 7 strobes address A0 - An applied to address input terminals 20 as a column address and controlling operation of column selection circuitry in the RAM port. Control signal *WB/*WE is a control signal for designating write per bit operation and data write mode. Write per bit operation is an operation mode in which data writing is performed with a predetermined bit masked in a case in which inputting/outputting of data is performed in a plurality of bits in the RAM port.

Control signal *DT/*OE is a control signal for designating a transfer mode for performing data transfer between the RAM port and the SAM port and a data output mode. Control signal DSF is a control signal for designating a flash write mode or a block write mode. The flash write mode is an operation mode in which the data stored in color register 200 is simultaneously written into memory cells on a selected row in random access memory cell array 1. The block write mode will be described in detail in the following. The symbol * given before a signal indicates that the signal is a signal of a negative logic (it is in an active state when it is at a low or "L" level).

External clock signal SC is a clock signal for determining the speed and timing of inputting/outputting of data in the SAM port. Control signal *SE is a control signal for enabling the SAM port. Control signal QSF is a control signal for informing the outside which data register is used in a case in which the memory cell array includes data registers of two systems. Specifically, although serial memory cell array 11 is illustrated having a function corresponding to one row in FIG. 2, it actually includes two independent data registers. The structure of the data registers includes a split buffer scheme in which each of them is implemented with a data register having a storage capacity of ½ row and a double buffer scheme in which each of them has a storage capacity of one row. The two independent data registers are brought to an active state by turn. Data is transferred from random access memory cell array 1 through transfer gate 10 to the data register in the active state.

Dual port RAM 100 further includes an address pointer 9 latching the column address from address buffer circuit 7 in response to the control signal from internal clock generating circuit 8 for generating a starting address 6c of serial selector 12. Now, operation will be simply described in the following.

Access to the RAM port is made in the same way as in a normal DRAM (Dynamic Random Access Memory). Specifically, address A0 - An applied to address input terminals 20 is strobed and latched by address buffer circuit 7 at the falling of control signal *RAS, and an internal row address is generated. Row decoder 2 receives the internal row address from address buffer circuit 7, selects a corresponding row in random access memory cell array 1, and making the potential of the selected row (word line) rise to "H" of the active state. Then, a sense amplifier included in a block 5 is activated, and information stored in memory cells MC connected to the selected row is detected, amplified, and latched.

Next, when control signal *CAS falls, address buffer circuit 7 strobes and latches address A0 - An applied to address input terminals 20, generates an internal column address, and applies it to column decoder 3. Column decoder 3 decodes the internal column address and generates a column selecting signal for selecting a corresponding column in memory cell array 1. I/O gate 5 connects the corresponding column to common data bus (hereinafter referred to as a RAM common data bus) 105 in response to the column selecting signal from column decoder 3. In the case of data writing, control signal *WB/*WE attains "L". An input buffer circuit included in RAM input/output buffer circuit 4 is activated in the timing of the later one of the falling of control signal *CAS and the falling of control signal *WB/*WE (if the data input/output terminal is used in common for data output and data input, control signal *CAS generally falls later), and it takes in data WIOi applied to data input/output terminal 22 and generates an internal write data onto RAM common data bus 105. This causes the data to be written into a memory cell MC on the crossing of the row and column selected by row decoder 2 and column decoder 3.

In data reading, control signal *DT/*OE is brought to an active state of "L", an output buffer circuit included in RAM input/output buffer circuit 4 is activated, and it generates an external read data from data on RAM common data bus 105 and transmits it to data input/output terminal 22. Normal operation of writing and reading of data in the RAM port is as described above. Now, operation of the SAM port will be described.

Whether the SAM port is in a data output mode or a data write mode is determined by a transfer cycle carried out immediately before. Specifically, when data is transferred from random access memory cell array 1 through transfer gate 10 to serial memory cell array 11, the SAM port is brought into the data read mode. In the transfer cycle (read transfer cycle), if control signal *DT/*OE is set to "L" of an active state, and control signal *WB/WE is set to "H", and control signal *SE is set to arbitrary state when control signal *RAS is made active of "L" in the normal read cycle in the RAM port, the memory cell data of the one row is transferred through transfer gate 10 activated in response to rising of control signal *DT/*OE to serial memory array 11 after sensing and amplifying of data in memory cells in one row in random access memory cell array 1.

Next, an address which is strobed when control signal *CAS falls to "L" is loaded in address pointer 9. The address 6c loaded in address pointer 9 is applied to serial selector 12 and designates the first selected bit position of serial selector 12. Thereafter, as external clock signal SC changes, the count value of signal converting circuit 16 is incremented one by one, the selected position of serial selector 12 changes accordingly, and data stored in serial memory cell array 11 is sequentially provided as an output through SAM input/output buffer circuit 14. Now, operation in a case in which the SAM port is set to the data write mode will be described.

First, when control signal *RAS is made to fall to "L", control signal *WB/*WE is set to "L", control signal *DT/*OE is set to "L", and control signal *SE is set to "H". Transfer gate 10 is activated in response to rising of control signal *DT/OE, and the contents stored in serial memory cell array 11 are transmitted to a selected row in random access memory cell array 1. At this time, row selecting operation is already performed by row decoder 2 in random access memory cell array 1 in response to control signal *RAS. Next, when control signal *CAS is made to fall to "L", a column address strobed by address buffer circuit 7 is loaded in address pointer 9. The column address 6c from address pointer 9 designates a bit position in memory cell array 11 into which data supplied from SAM input/output buffer circuit 14 is written first.

Data writing into serial memory cell array 11 and data reading therefrom are performed in response to clock signal SC. In this case, it is unnecessary to perform row selecting operation and column selecting operation as in a normal DRAM, so that the access time of the SAM port is a short time in the range of 10 to 30 ns. Therefore, it is possible to perform serial inputting-/outputting of data at high speed, and dual port RAMs are widely used in the image processing field requiring high-speed processing of large amount of data.

There is a strong tendency to add various functions to such a dual port RAM for performing various image processing easily and at high speed. Such extended functions are generally designated by combination of the states of externally applied control signals at the fall timing of each of control signals *RAS and *CAS. An example of the timing of the signals on the occasion when the extended functions are designated is illustrated in FIG. 3. It is possible to realize various extended functions by setting the signals which are in the timing indicated by broken lines in FIG. 3 to "H" or "L". Control signal DSF is set to "H" or "L" at the fall timing of control signals *RAS and *CAS, and a desired extended function is selected by combination of control signals *DT/*OE, *WB/*WE, and *SE. For example, loading of data into color register 200 illustrated in FIG. 2 is performed by setting control signals *CAS, *DT/*OE, *WB/*WE to "H" and setting control signal DSF to "H" at the falling of control signal *RAS. Generally, when control signal DSF is set to "H", an extended function is performed.

There is an operation mode referred to as block write in such extended functions. As illustrated in FIG. 4, the block write mode selects a row X in random access memory 1 by row decoder 2 (See FIG. 2), and then selects a column Y by an internal column address which is an internal column address generated from address buffer circuit 7 except for least significant two bits. In row X, four bits M1, M2, M3, and M4 starting at column Y are simultaneously selected, and writing of data stored in color register 200 (see FIG. 2) is performed thereinto. In the block write mode, data can be written into four bits of memory cells in one cycle, so that it is possible to greatly reduce the time required for plotting. If such block write mode is used, it is possible to clear a predetermined window region of a display unit or repaint the color of that part at high speed. Specifically, in the block write mode, one row is divided into a plurality of groups each including four bits, and data can be written simultaneously into one group. A structure for performing the block write is illustrated in detail in FIG. 5.

FIG. 5 is a diagram illustrating a structure of a part related to data writing in a RAM port in a dual port RAM. Referring to FIG. 5, a dynamic random access memory cell array 1 includes memory cell groups MG each including a plurality of columns (normally four columns). Although only one row (word line WL) in memory cell group MG is illustrated in FIG. 5, memory cell group MG includes all rows in memory cell array 1. Memory cell array 1 includes bit lines 102a and 102b connected to memory cells MC in one column. Bit lines 102a and 102b are arranged in a pair, and data complementary to each other are transmitted thereon. A memory cell MC is arranged at crossing of word line WL and one of bit lines 102a and 102b in a pair.

A sense amplifier SA is provided for detecting data on a bit line pair 102a and 102b. Sense amplifier SA is included in a sense amplifier group 5a. Column selecting gates SG which are brought to ON state in response to a block selecting signal BSi are provided for respective bit line pairs 102a and 102b. Block selecting signal BSi is a signal generated by decoding address bits of an internal column address except for least significant two bits, for example, and it is illustrated being generated from column decoder 3 in FIG. 2. The four pairs of bit lines 102a, 102b are connected through column selecting gates SG to different RAM common data buses 105a-105d, respectively.

In a dual port RAM having the block write function, RAM common data bus 105 includes four data bus lines 105a, 105b, 105c, and 105d for writing data simultaneously into four bits of memory cells. Memory cells MC1-MC4 in the memory cell group MG are connected through column selecting gates SG1-SG4 to common data bus lines 105a-105d, respectively. Memory cell MCI is connected through column selecting gate SG1 to common data bus line 105a. Memory cell MC2 is connected through column selecting gate SG2 to common data bus line 105b. In the same way, memory cell MC4 is connected to common data bus line 105d. Memory cell MC3 connected to common data bus line 105c is not illustrated for simplifying the drawing. Column selecting gates SG1-SG4 constitute a group, and they are brought to ON state simultaneously in response to block selecting signal BSi. Column selecting gates SG1-SG4 are included in block 5 illustrated in FIG. 2 and constitute an I/O gate block 5b.

Transfer gate 10 for performing data transfer between the RAM port and the SAM port includes unit transfer gates UT provided corresponding to respective pairs of bit lines 102a and 102b. Unit transfer gate UT includes a transmission gate which is brought to a conductive state in response to a transfer indicating signal DT. Serial memory cell array 11 includes unit registers UR provided corresponding to respective pairs of bit lines 102a and 102b. Unit register UR is implemented with an inverter latch. Unit transfer gate UT in ON state enables data transfer between corresponding bit lines 102a and 102b and a corresponding unit register UR. Selection of a memory cell in serial memory cell array 11 is performed by serial selector 12 (12a, 12b). Serial selector 12 includes a circuit 12b for generating a selection signal according to a pointer from address pointer 9 and a timing signal from converting circuit 16 and a circuit 12a for connecting a corresponding serial memory cell to the SAM common data bus according to a selection signal from circuit 12b. RAM input/output buffer circuit 4 includes a selection circuit 401 for changing over operation between data writing in one bit and data writing in the block write mode, buffer amplifiers 402a to 402d provided to respective RAM common data bus lines 105a to 105d for transmitting written data from selection circuit 401 onto corresponding RAM common data bus lines, and a control circuit 404 for controlling operation of selection circuit 401 and buffer amplifiers 402a to 402d.

Control circuit 404 generates internal write enable signals WEa to WEd for enabling buffer amplifiers 402a to 402d and a control signal for controlling selection operation of selection circuit 401 in response to internal write indicating signal WE, internal column address CA of the least significant two bits, for example, and block write indicating signal BW. Internal write indicating signal WE and block write indicating signal BW are generated from internal clock generating circuit 8 illustrated in FIG. 2. Internal column address CA is generated from address buffer circuit 7 illustrated in FIG. 2.

When block write is instructed under the control of controlling circuit 404, selection circuit 401 transmits data stored in color register 200 to all of buffer amplifiers 402a to 402d. If normal data writing in one bit is instructed, selection circuit 401 transmits written data WIOi applied to common data input/output terminal 22 to a buffer amplifier designated by controlling circuit 404. Buffer amplifiers 402a to 402d are brought to an output enable state when internal write enable signals WEa to WEd are applied, respectively, and they are otherwise set to an output high impedance state. Color register 200 stores written data WIOi applied to common data input/output terminal 22 in response to a control signal (store instructing signal) $\phi$ generated on the occasion of the block write mode. Now, the block write mode operation will be described with reference to FIG. 6 and FIG. 7 showing the operation waveforms thereof.

The block write mode operation includes two operation cycles. One is a load color cycle for loading data into color register 200, and the other one is a block write cycle for writing data stored in color register 200 into four bits of memory cells. First, referring to FIG. 6, the load color cycle will be described.

The load color cycle is performed by setting control signal DSF to "H" at the falling edge of control signal *RAS and setting control signal DSF to "L" at the falling edge of control signal *CAS. Control signal DSF corresponds to block write indicating signal BW illustrated in FIG. 5. First, when control signal *RAS falls, control signal DSF is set to "H". Responsively, internal control signal BW is raised to "H", and control circuit 404 determines that the block write mode is set. In response to the falling of control signal *RAS, row selecting operation is performed according to an external row address, and selection of memory cells in one row and amplification of data in the selected memory cells by sense amplifier SA are performed in the RAM port.

Next, control signal DSF is set to "L" at the falling edge of control signal *CAS. Responsively, control circuit 404 determines that data applied to data input/output terminal 22 should not be written into memory cell array 1 and forbids selection operation of selection circuit 401. In addition, control circuit 404 disregards internal write indicating signal WE generated in response to "L" of control signal *CAS and control signal *WB/*WE and sets buffer amplifiers 402a to 402d to an output high impedance state. In memory cell array 1, block selecting operation is performed at the falling edge of control signal *CAS in accordance with a block indicating signal which is an external column address except for the least significant two bits, and block selecting signal BSi rises. In this case, however, RAM common data bus lines 105a–105d are in a floating state, and data on respective pairs of bit lines 102a, 102b are latched by sense amplifier SA.

On the other hand, at the falling edge of control signal *CAS, control signal $\phi$ rises to "H" in response to control signal *WB/*WE being at "L" and control signal DSF being at "L". Color register 200 is activated in response to control signal $\phi$ and stores data WIOi applied to RAM data input/output terminal 22. This completes loading of data for the block write into color register 200. Thereafter, all of control signals *RAS, *CAS and control signal *WB/*WE rise to "H", and the load color cycle is completed. At this time, in memory cell array 1, only rewriting a data latched in a sense amplifier into a memory cell is carried out. Now, referring to FIG. 7, the block write cycle will be described.

In the block write cycle, control signal DSF is set to "L" at the falling edge of control signal *RAS. In memory cell array 1, in response to the falling of control signal *RAS, row selecting operation is performed in response to an external address, and one word line WL is selected. Then, sense amplifier SA is activated, and data in memory cells connected to that one row is sensed and amplified. Next, when signal *CAS falls, signal DSF is set to "H". In this case, control signal $\phi$ is not generated, and color register 200 does not perform data latching. Control circuit 404 generates all of internal write indicating signals WEa - WEd to buffer amplifiers 402a–402d in response to control signal BW and internal write indicating signal WE and also applies a block write indicating controlling signal to selection circuit 401.

Selection circuit 401 transmits data stored in color register 200 to all of buffer amplifiers 402a–402d. Consequently, internal write data corresponding to the data stored in color register 200 is transmitted from buffer amplifiers 402a–402d onto common data bus lines 105a–105d. On the other hand, at the falling edge of control signal *CAS, block selecting signal BSi is generated by column decoder 3, and respective bit lines 102a, 102b in a selected memory cell group MG are connected to corresponding common data bus lines 105a–105d, respectively. Then, the data stored in color register 200 is written into memory cells MC1–MC4 in the selected memory cell group MG. Then each control signal returns to an initial state to complete the block write cycle.

Control circuit 404 controls selection operation of selection circuit 401 according to the timing relationship between control signal (block write indicating signal) BW and internal write indicating signal WE. Specifically, when block write indicating signal BW is generated earlier than external write indicating signal WE, control circuit 404 determines that it is the data load cycle to color register 200 and forbids selection operation of selection circuit 401 as well as generation of internal write enable signals WEa - WEd. In addition, when block mode indicating signal BW is brought to "H" of an active state on the occasion of generation of internal write indicating signal WE, control circuit 404 determines that it is the block write cycle, generates all internal write indicating signals WEi (i=a−d), forbids selection operation of selection circuit 401, and connects color register 200 to all buffer amplifiers 402i (i=a−d).

There is a structure of a memory in which data loading into the color register is set when control signal DSF is at "H" both at the falling edges of control signals *RAS and *CAS in the block write mode operation as described above. When control signal DSF is at "L" both at the falling edges of control signals *RAS and *CAS, a dual port RAM of such a structure performs normal data writing operation in one bit.

Control signal $\phi$ is not generated when control signal DSF is set to "H" at the falling edge of control signal *CAS, and data latching by color register 200 is forbidden.

By performing the block write mode operation, it is possible to write the same data into four bits of memory cells simultaneously in one memory cycle and perform clearing or repainting of the color of a window region at high speed. However, in order to realize the block write function, it is necessary to provide the same number of RAM common data bus line pairs 105 as the number of columns which are subject to the block write operation. In order to perform block write in 8 bits or 16 bits, 8 pairs or 16 pairs of RAM common data bus lines are necessary, and the chip area is increased.

In addition, a selection circuit is required for making a switching between the block write operation and the normal write operation in one bit. The selection circuit transmits data stored in the color register onto all RAM common data bus line pairs in the block write mode and selects one pair of the plurality of common data bus line pairs and transmits internal write data in the normal write. Accordingly, if the scale (the number of bits) of block write is enlarged, the scale of the selection circuit is also enlarged in accordance with that, and the scale of the RAM input/output buffer circuit is enlarged. In addition, if the number of bits of block write is increased, there is a problem that the structure of the device for performing bus selecting operation in the selection circuit and changing the RAM common data bus lines for the block write mode and for the normal write mode becomes complicated.

SUMMARY OF THE INVENTION

An object of the present invention is to provide a semiconductor memory device having a block write function which is capable of realizing a logic for selecting a RAM common data bus line with a simple structure without increasing the chip area.

Another object of the present invention is to provide a semiconductor memory device which can easily increase the number of bits of block write.

A semiconductor memory device according to the present invention includes a memory cell array divided into a plurality of blocks. The blocks are obtained by dividing the memory cell array in the column direction into blocks each including a plurality of columns. The semiconductor memory device further includes write means responsive to written data for generating internal write data, column selecting means responsive to an applied address for connecting a corresponding column in the memory cell array to the write means, and storage means for storing the written data. The storage means stores an externally applied written data in response to a first block write indicating signal.

The semiconductor memory device further includes block write transfer means provided between the storage means and each of the plurality of memory cell array blocks for connecting the storage means and a corresponding memory cell array block in response to a second block write indicating signal and a block designating signal and transmitting data stored in the storage means to each column in the corresponding memory cell array block.

In block write mode, one block is selected, and data is written into that block at the same time.

On the other hand, normal data writing in one bit is performed through the writing means. The path through which the writing means writes data into a selected column in the memory cell array and the path through which data is transmitted from the storage means to a memory cell array block in block writing can be separated. Thus, a complicated selection circuit for changing bus connection between in the block write mode and in the normal write mode in one bit becomes unnecessary. In addition, only one pair of RAM common data bus lines is required for performing data writing in one bit, and so it is possible to reduce the occupied area of the common data bus line pair.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
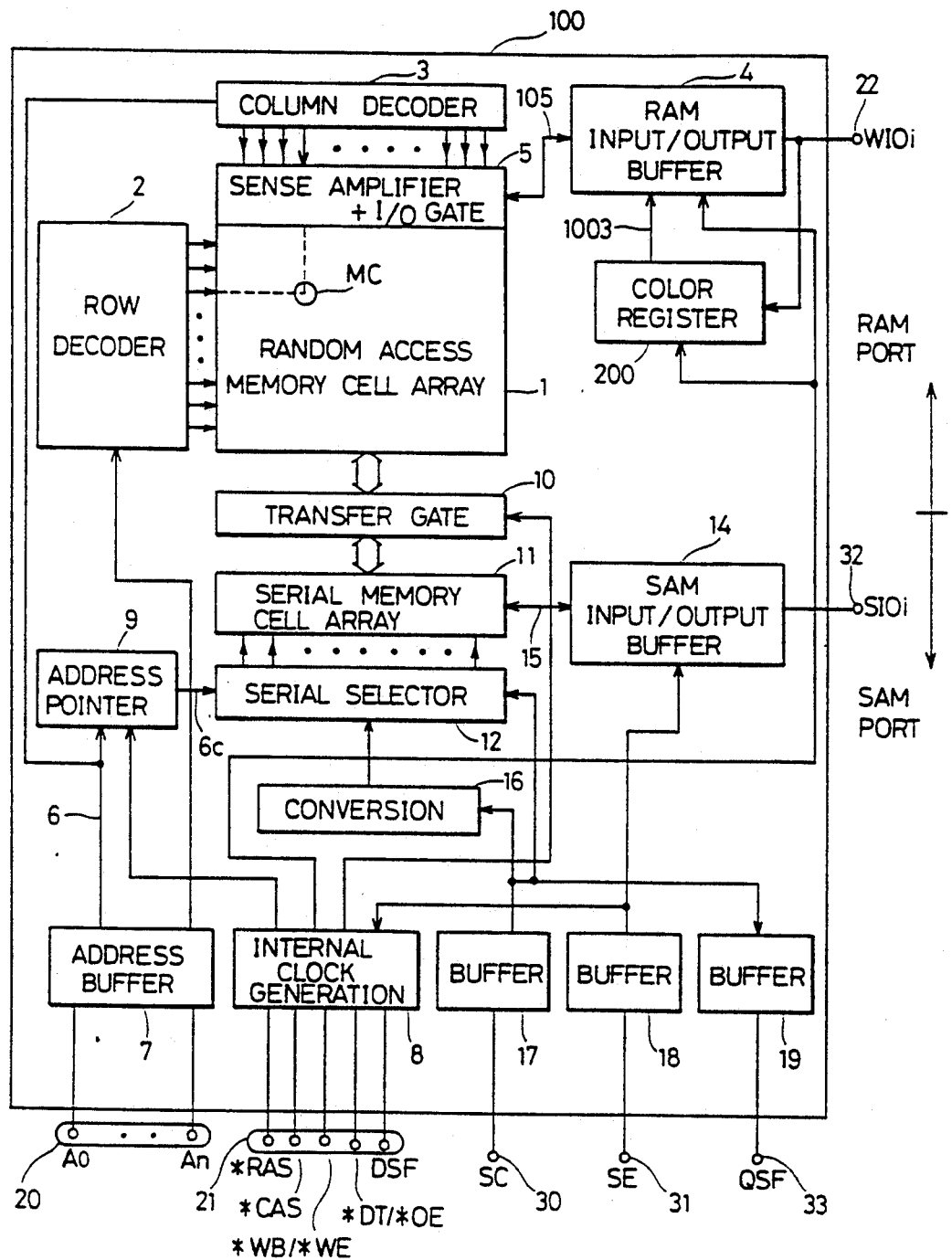
FIG. 2 is a schematic diagram illustrating the whole structure of a conventional dual port RAM.
Figure 3:
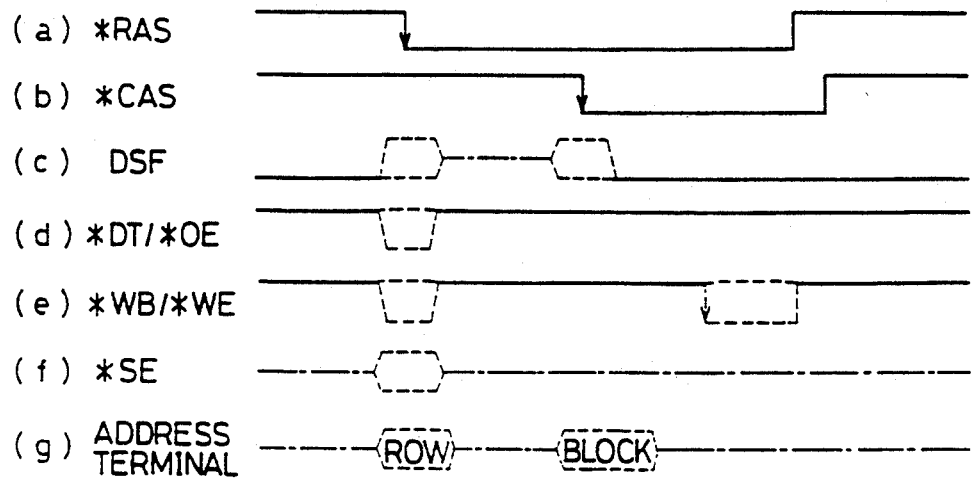
FIG. 3 is a signal waveform diagram illustrating operation timing for realizing various functions of the conventional dual port RAM.
Figure 4:
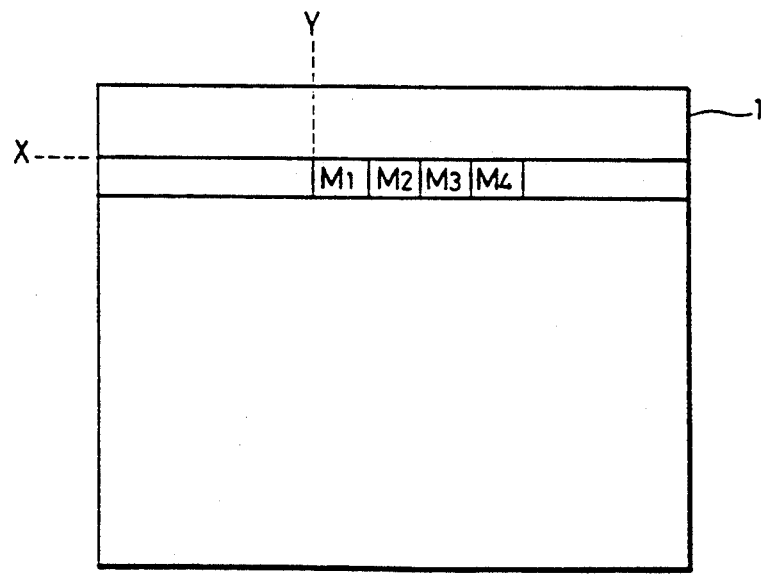
FIG. 4 is a diagram for explaining a block write mode operation.
Figure 5:
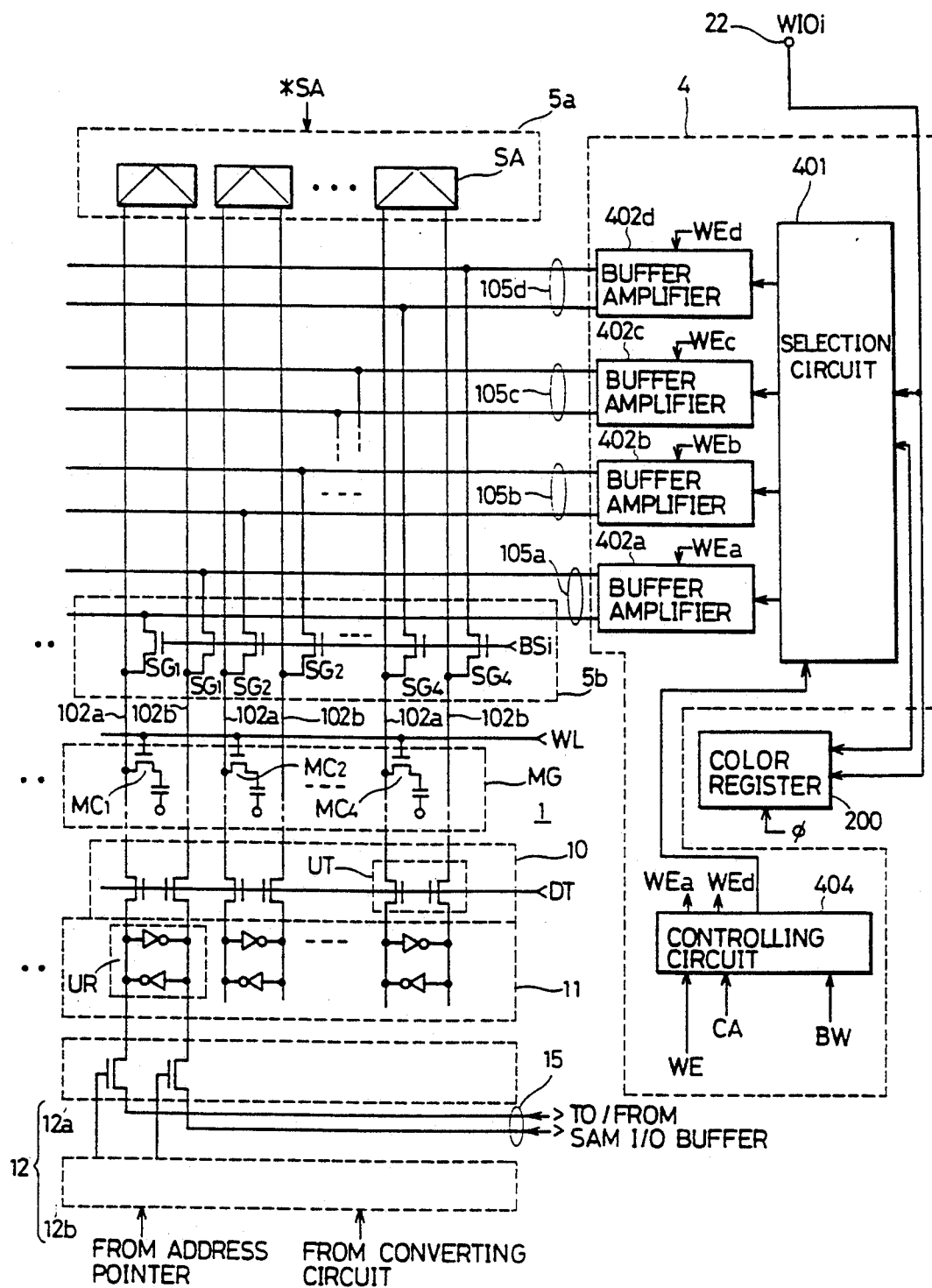
FIG. 5 is a diagram illustrating a part related to block write operation in the conventional dual port RAM.
Figure 6:
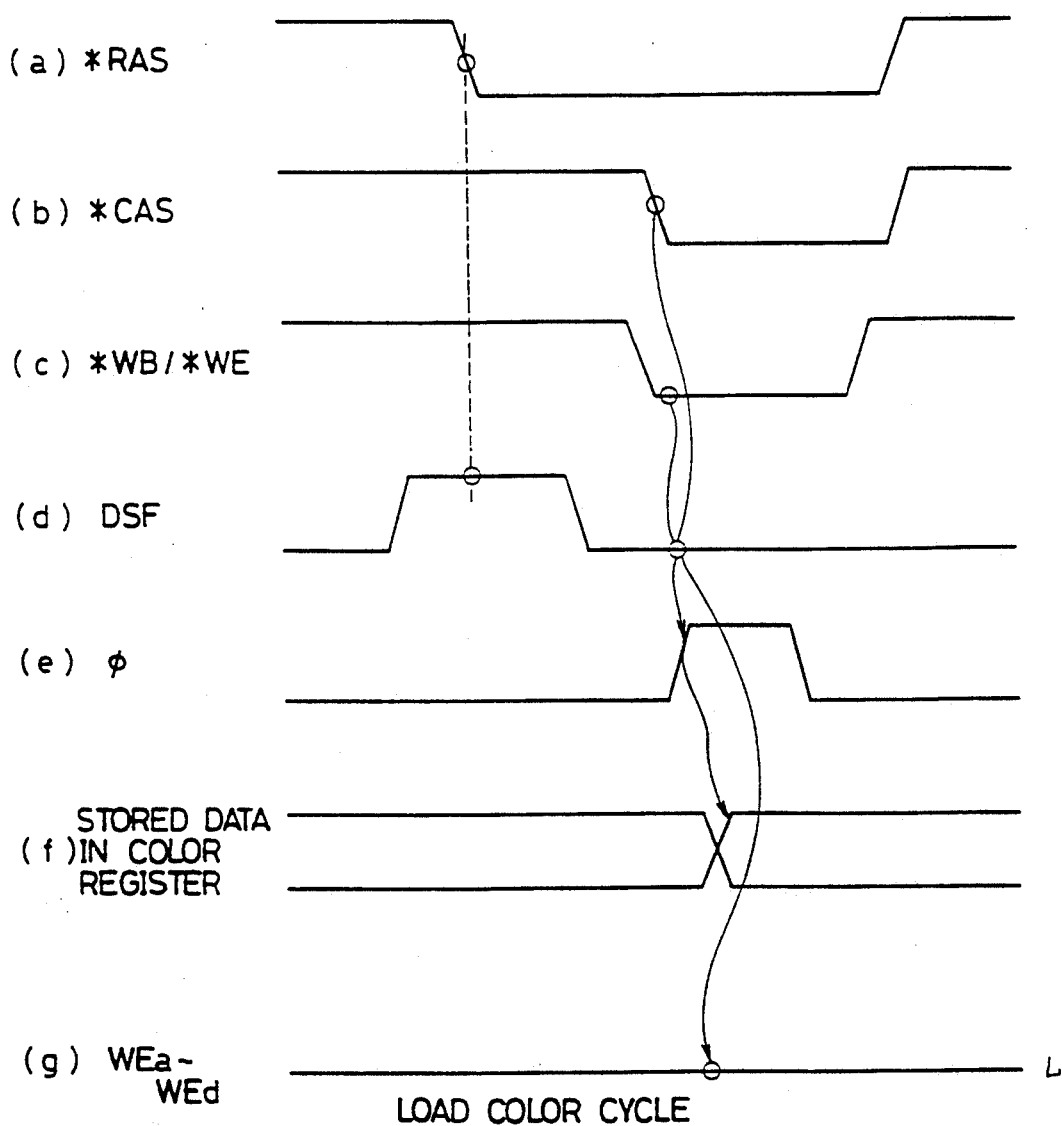
FIG. 6 is a signal waveform diagram illustrating an operation in a load color cycle in the conventional dual port RAM.
Figure 7:
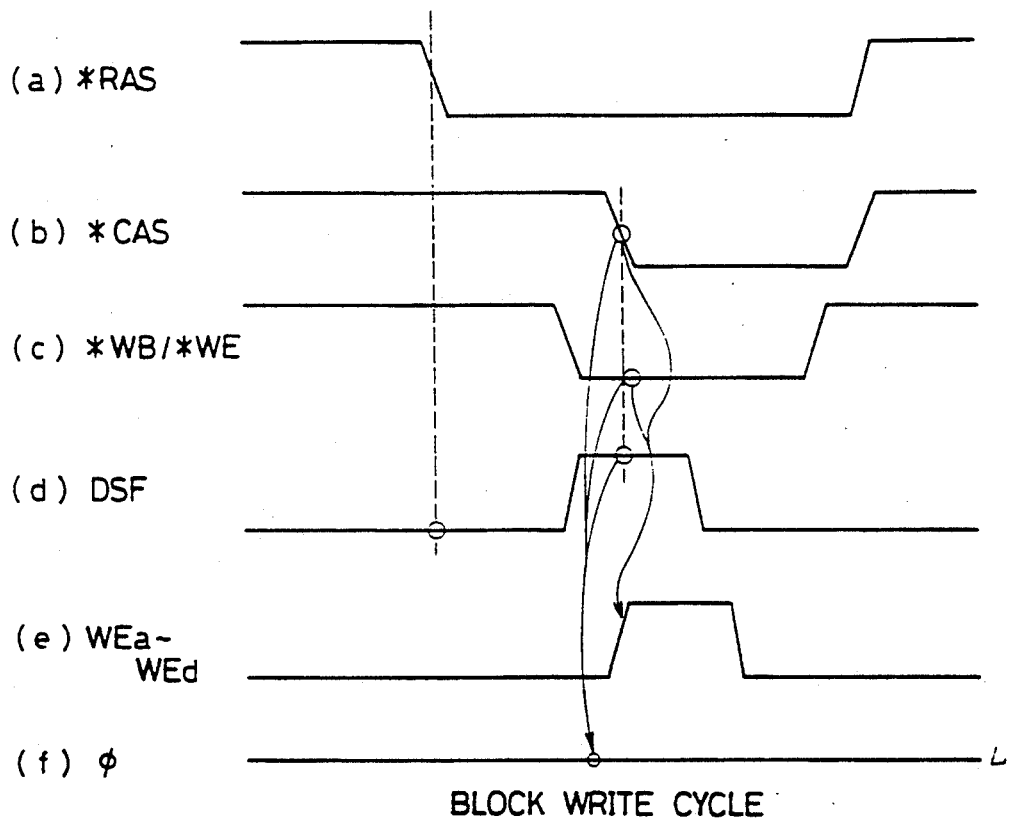
FIG. 7 is a signal waveform diagram illustrating an operation in a block write cycle in the conventional dual port RAM.
Figure 8:
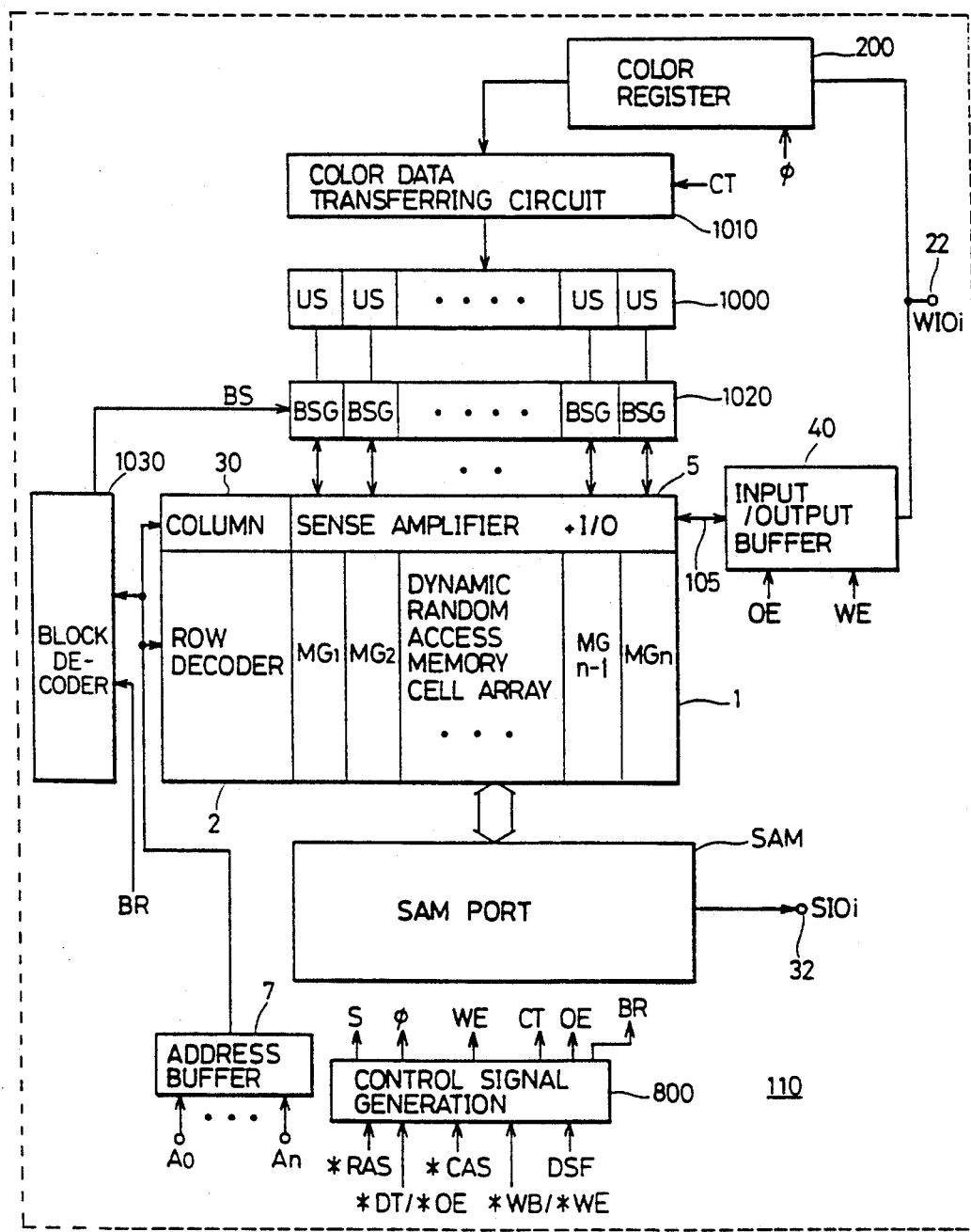
FIG. 8 is a diagram illustrating the whole structure of a semiconductor memory device according to an embodiment of the present invention.

FIG. 8 is a schematic diagram illustrating the whole structure of a semiconductor memory device according to an embodiment of the present invention. Although only a structure for performing inputting/outputting of data in one bit are illustrated in FIG. 8, it is also possible to extend it easily in a case in which inputting/outputting of data is performed in a plurality of bits. When inputting/outputting of data is performed in a plurality of bits, a plurality of the structures of RAM port illustrated in FIG. 8 may be used. In FIG. 8, a SAM port for accessing data only serially is the same as the one in the conventional semiconductor memory device (See FIG. 2) and illustrated only as a block SAM.

Referring to FIG. 8, a semiconductor memory device 110 includes a dynamic random access memory cell array 1 divided into a plurality of memory cell blocks MG1-MGn. Memory cell blocks MG1-MGn are obtained by dividing the dynamic random access memory cell array in the column direction. Semiconductor memory device 110 further includes an address buffer circuit 7 receiving an externally applied address A0 - An for generating an internal address, a row decoder 2 for decoding the internal row address from address buffer circuit 7 and selecting a row in memory cell array 1, a column decoder 30 for receiving the internal column address from address buffer circuit 7 and selecting a column in memory cell array 1, and a block decoder 1030 receiving the column address except for the least significant two bits, for example, from address buffer circuit 7 as a block designating address for generating a block selecting signal BS for selecting a corresponding block from memory cell array 1.

Semiconductor memory device 110 further includes a sense amplifier for sensing and amplifying data in the selected row and an I/O gate for connecting the column selected by column decoder 30 to a RAM common data bus 105. The sense amplifier and the I/O gate are illustrated as one block 5 in FIG. 8.

Semiconductor memory device 110 further includes an input/output buffer circuit 40 activated in response to an internal output indicating signal OE and an internal write indicating signal WE for performing reading and writing of data in one bit, a color register 200 for storing data for block write, a color data transferring circuit 1010 for transferring the data stored in color register 200, a color data storing circuit 1000 for storing the data transferred from color data transferring circuit 1010, and a block selecting circuit 1020 for transmitting the data stored in color data storing circuit 1000 to a corresponding block.

Color data storing circuit 1000 for storing data (color data) for block write includes storage elements US provided corresponding to respective memory cell blocks MG1-MGn. Block selecting circuit 1020 includes block selecting gates BSG provided between each of blocks MG1-MGn in memory cell array 1 and corresponding one of storage elements US in color data storing circuit 1000 and each transmitting data in a corresponding storage element US to all columns in a corresponding memory cell block.

Semiconductor memory device 110 further includes a control signal generating circuit 800 responsive to externally applied control signals *RAS, *DT/*OE, *CAS, *WB/*WE, and DSF for generating various internal control signals S, $\phi$, WE, CT, OE, and BR as a peripheral circuit. Control signal $\phi$ gives timing at which color register 200 strobes and latches data. Control signal CT gives timing at which data in color register 200 is transferred to color data storing circuit 1000.

In the case of the structure illustrated in FIG. 8, the normal data writing/reading in one bit is performed through input/output buffer circuit 40 and RAM common data bus 105. Therefore, input/output buffer circuit 40 can be implemented with simple input buffer circuit and output buffer circuit without including a complicated selection circuit. Block write operation is carried out through color register 200, color data transferring circuit 1010, block write data storing circuit 1000, and block write selecting circuit 1020. In this case, block writing is not performed through RAM common data bus 105, and it is unnecessary to provide a plurality of pairs of common data bus lines. In addition, storage elements US and block write selecting gates BSG in color data storing circuit 1000 and block selecting circuit 1020 are provided corresponding to memory cell blocks MG in memory cell array 1. Accordingly, it is possible to easily increase or reduce the number of bits included in a block and to easily extend the number of bits in which block write is performed.

Figure 9:
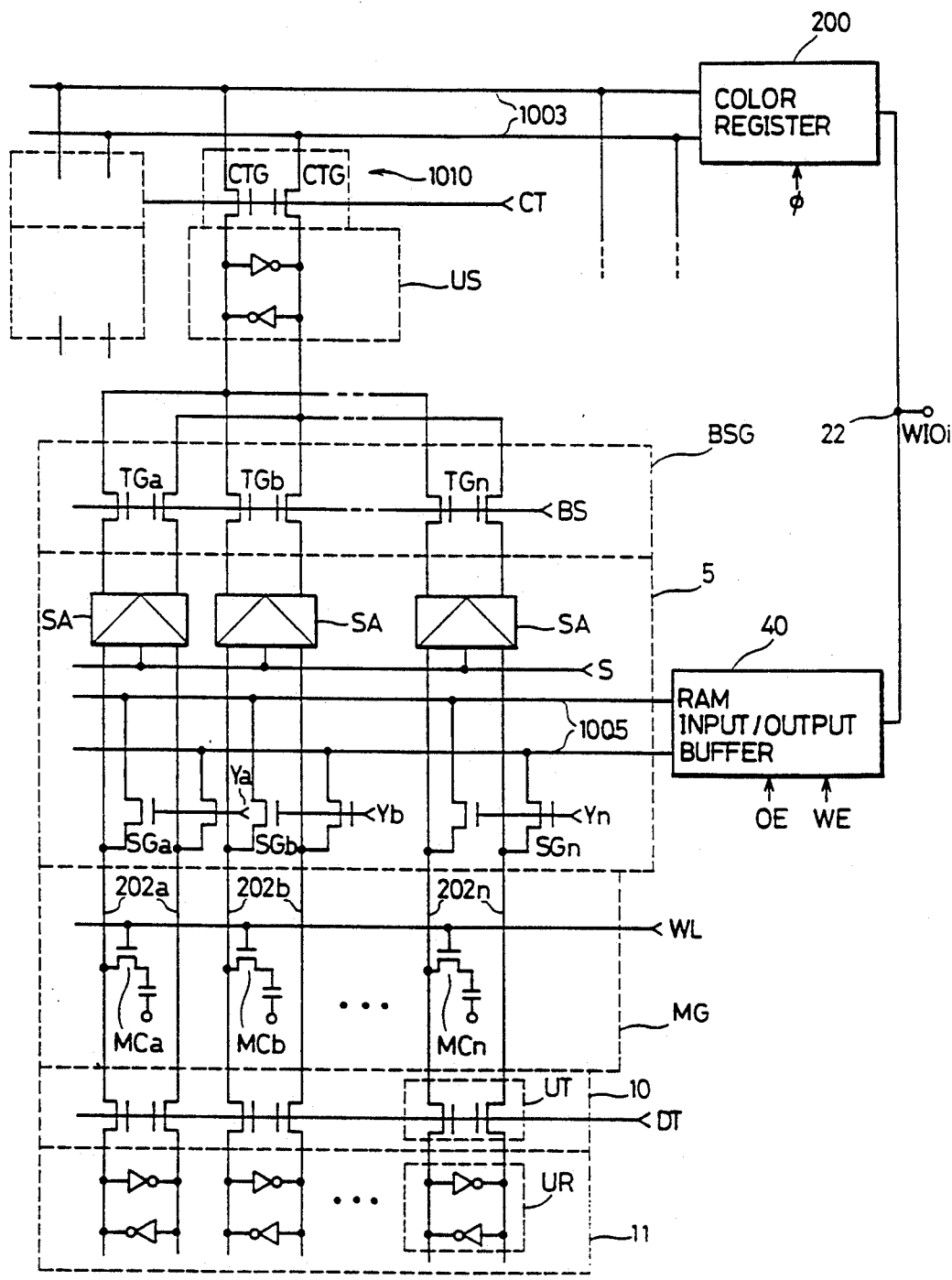
FIG. 9 is a diagram illustrating the structure of a main part of the semiconductor memory device according to an embodiment of the present invention.

FIG. 9 is a diagram illustrating a structure for one block in the semiconductor memory device illustrated in FIG. 8. Referring to FIG. 9, a memory cell block MG includes a plurality of memory cells MCa, MCb, . . . , and MCn connected to a word line WL. Here, one of the memory cell blocks MG1 - MGn illustrated in FIG. 8 is generically illustrated as a memory cell block MG. A sense amplifier +I/O block 5 includes sense amplifiers SA provided corresponding to respective bit line pairs 202a, 202b, . . . and 202n, and column selecting gates SGa, SGb, . . . and SGn provided corresponding to respective bit line pairs 202a, 202b, . . . and 202n. Column selecting signals Ya, Yb, . . . , and Yn from column decoder 30 illustrated in FIG. 8 are applied to column selecting gates SGa, SGb, . . . and SGn, respectively. Only one column selecting gate SG is brought to ON state and connects a corresponding bit line pair 202 (indicating bit lines 202a, . . . , 202n representatively) to RAM common data bus 105.

Block selecting gate BSG includes color data transferring gates TGa, TGb, . . . and TGn provided corresponding to respective bit line pairs 202a, 202b, . . . and 202n. Color data transferring gates TGa - TGn are brought to ON state in response to a block selecting signal BS from a block decoder 1030. Storage element US included in color data storing circuit 1000 includes an inverter latch provided in common to color data transferring gates TGa - TGn. Color data transmitted from color register 200 through data bus 1003 is stored in storage elements US through color data transferring gates CTG. Color data transferring gates CTG are provided corresponding to respective storage elements US and brought to ON state in response to color data transfer indicating signal CT.

Color data transferring bus 1003 is provided in common for all color data transferring gates CTG and transmits data stored in color register 200. The color register 200 may be of any structure provided that data WIOi applied to a data input/output terminal 22 is latched in response to load indicating signal $\phi$ which is a first block write indicating signal for designating loading of color data for block write and the latched data is transmitted onto data bus 1003.

The SAM port includes a transfer gate 10 and a serial memory cell array 11 as in the conventional one and includes unit transfer gates UT and unit registers UR provided corresponding to respective bit line pairs. Now, operation will be described.

In the normal data writing in one bit, an external address A0 - An is latched by address buffer circuit 7 at the falling edge of control signal *RAS, and an internal row address is generated. Row decoder 2 selects one word line WL in accordance with the internal row address and raises the potential of the selected word line WL to "H". Then, sense amplifier activating signal S is brought to an active state, and each sense amplifier SA senses and amplifies the potential difference on a corresponding bit line pair 202. Then, control signal *CAS falls to "L", and an internal column address is generated from address buffer circuit 7. Column decoder 30 generates a column selecting signal for selecting one column in response to the internal column address. If the column selecting signal is Ya, bit line pair 202a is connected through column selecting gate SGa to RAM common data bus 105.

RAM input/output buffer circuit 40 is activated in response to internal write indicating signal WE which is generated when external control signals *CAS and *WB/*WE both attain "L" and generates an internal write data corresponding to written data WIOi applied to RAM data input/output terminal 22 and transmits it to RAM common data bus 105. The internal write data on common data bus 105 is transmitted to bit line pair 202a and written into memory cell MCa. The above-described data writing in one bit is the same as that in the normal DRAM (dynamic random access memory).

Now, the block write mode operation will be described.

Figure 10:
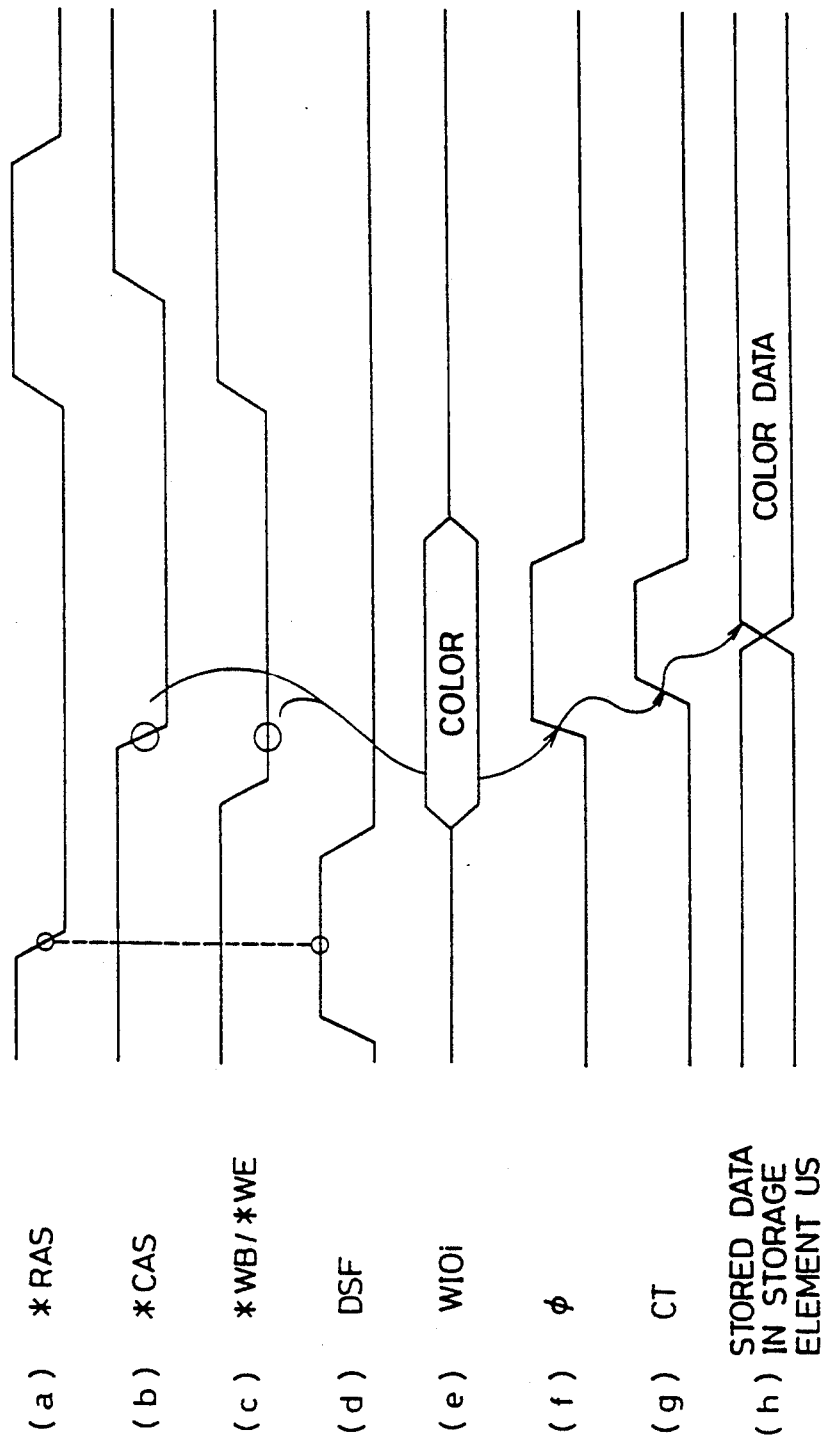
FIG. 10 is a signal waveform diagram illustrating an operation on the occasion of a load color cycle in the semiconductor memory device according to an embodiment of the present invention.

The block write mode operation includes two cycles, a load color cycle and a block write cycle. First, referring to FIG. 10, the load color cycle will be described. The load color cycle is set by making control signal DSF attain "H" and control signal *WB/*WE attain "H" at the falling edge of control signal *RAS. At this time, the row selecting operation is performed by row decoder 2 in accordance with control signal *RAS, and then the sensing operation is performed by sense amplifiers SA.

Thereafter, control signal DSF is set to "L" at the falling edge of control signal *CAS. Color data load (store) indicating signal $\phi$ which is the first block write indicating signal is generated from control signal generating circuit 8 when control signals *CAS and *WB/*WE both attain "L". Color register 200 latches data WIOi applied to RAM data input/output terminal 22 as color data in response to color data load indicating signal $\phi$ and transmits it to color data transmitting bus 1003. Color data transfer indicating signal CT having a time width of a predetermined period is generated from control signal generating circuit 800 in response to rising of color data load indicating signal $\phi$. Responsively, all color data transfer gates CTG included in color data transferring circuit 1010 are brought to ON state, and each storage element US included in color data storing circuit 1000 stores that data.

The column selecting operation should be performed in response to control signal *CAS in memory cell array 1. However, since the load color cycle has been already designated by combination of control signal *RAS and control signal DSF, decoding operation by column decoder 30 and generation of internal write indicating signal WE to input/output buffer circuit 40 are forbidden. In addition, operation of block decoder 1030 and generation of block selecting signal BS are also forbidden in the load color cycle. With the above operation, loading of color data into color data storing circuit 1000 is performed. Then, control signals *RAS and *CAS both rise to "H". Now, the circuit structure for generating color data transfer indicating signal CT will be described.

Figure 11:
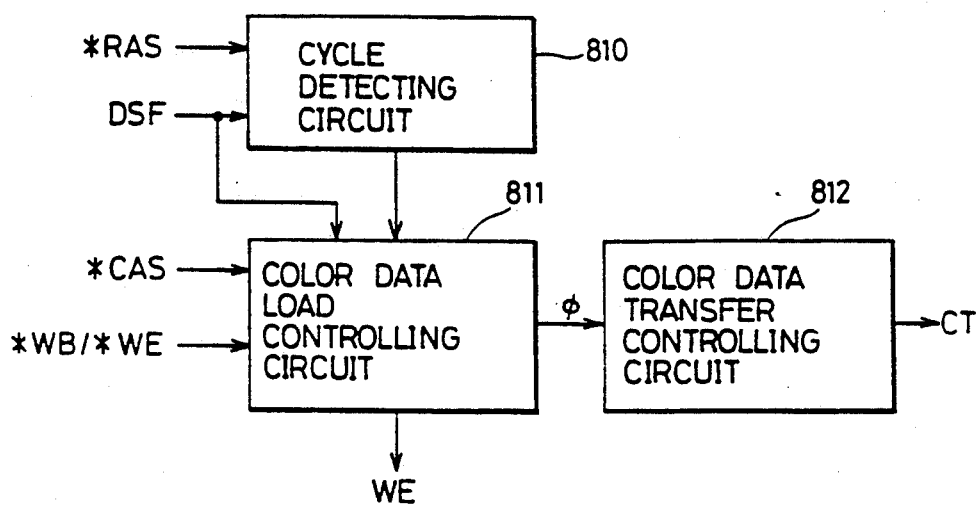
FIG. 11 is a block diagram illustrating an example of a structure of a control circuit for realizing the load color cycle illustrated in FIG. 10.

FIG. 11 is a schematic circuit block diagram of color data transfer indicating signal generating circuitry. Referring to FIG. 11, color data transfer indicating signal generating circuitry includes a cycle detecting circuit 810 responsive to control signal *RAS and control signal DSF for detecting whether the load color cycle is designated or not, a color data load controlling circuit 811 responsive to control signal *CAS, control signal *WB/*WE and a cycle detecting signal from cycle detecting circuit 810 for generating a color data load indicating signal $\phi$ and an internal write indicating signal WE, and a color data transfer controlling circuit 812 responsive to color data load indicating signal $\phi$ for generating a color data transfer indicating signal CT.

Cycle detecting circuit 810 generates a signal which indicates that a load color cycle for loading color data in color register 200 is designated when control signal DSF is at "H" at the falling edge of control signal *RAS. A latch circuit which latches and provides control signal DSF using control signal *RAS as a clock signal may be employed for the cycle detecting circuit 810. Color data load controlling circuit 811 generates load register indicating signal $\phi$ and forbids generation of internal write indicating signal WE when control signal *CAS and *WB/*WE both attain "L" with a load color cycle detecting signal from cycle detecting circuit 810 being in an active state.

Color data load controlling circuit 811 forbids generation of internal write indicating signal WE when control signal DSF is at "H" at the falling edge of control signal *CAS. When the load color cycle detecting signal from cycle detecting circuit 810 is in an inactive state, and when control signal DSF is at "L" of an inactive state at the falling of control signal *CAS, color data load controlling circuit 811 generates internal write instructing signal WE in response to control signal *CAS and control signal *WB/*WE. Various structures can be employed for the structure of color data load controlling circuit 811, and it may be of any structure, provided that generation of internal write indicating signal WE is forbidden when control signal DSF is at "H" at the falling edge of any of control signals *RAS and *CAS, and color data load indicating signal $\phi$ is generated when control signal DSF is at "H" at the falling edge of control signal *RAS, and control signal DSF is at "L" at the falling edge of control signal *CAS.

Figure 12:
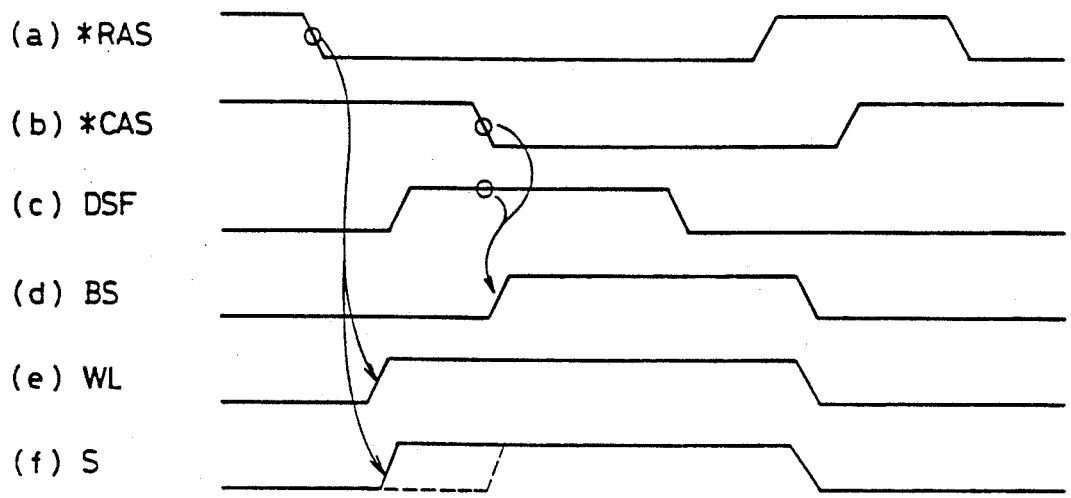
FIG. 12 is a signal waveform diagram illustrating an operation in a block write cycle in the semiconductor memory device according to an embodiment of the present invention.

Color data transfer controlling circuit 812 is implemented with a one shot pulse generating circuit generating a one-shot pulse in response to color data load indicating signal φ, for example. Now, the block write operation in which color data stored in color data storing circuit 1000 is written into a memory cell block will be described with reference to an operation waveform diagram of FIG. 12.

In the block write cycle, control signal DSF is set to "L" at the falling edge of control signal *RAS. Row decoder 2 performs the row selecting operation in accordance with external address A0 - An in response to falling of control signal *RAS and selects one word line WL in memory cell array 1. The potential on the selected word line WL rises to "H". After the potential of the selected word line WL rises to "H", sense amplifier activating signal S is brought to an active state ("H" level in FIG. 12), and each sense amplifier SA senses and amplifies memory cell data on a corresponding bit line pair.

Then, control signal *CAS falls. Control signal DSF is set to "H" at the falling edge of control signal *CAS. Thus, the block write cycle is designated. If the block write cycle is designated, block decoder 1030 is activated. Block decoder 1030 decodes an internal column address which is an internal column address from address buffer circuit 7 except for the least significant two bits, for example, and generates a block selecting signal BS for selecting one block selecting gate BSG of block selecting circuit 1020. If block selecting signal BS is generated, all of transfer gates TGa - TGn in the selected block selecting gate BSG are brought to ON state. Stored data in storage element US provided corresponding to the selected block is transmitted onto respective bit line pairs 202a–202n in the selected memory cell block MG.

The driving capability of storage element US is greater than the latching capability of sense amplifier SA, and data on respective bit line pairs 202a–202n correspond to color data stored in storage element US. Writing of color data into respective memory cells MCa - MCn in memory cell block MG is thus completed. Timing at which sense amplifier activating signal S is activated in the block write cycle may be set after block selecting signal BS is generated, as indicated by a broken line in FIG. 12.

Column decoder 30 is preferably brought to an inactive state in response to the block write cycle instruction, so as to forbid the column selecting operation in the memory cell array. Accordingly, column selecting signal Y is not generated, and column selecting gates STa - STn all remain in OFF state. Furthermore, in the block write cycle, generation of internal write indicating signal WE is forbidden, and the RAM input buffer circuit included in input/output buffer circuit 40 is kept in an output high impedance state.

While it has been explained that sense amplifier activating signal S may be activated after block selecting signal BS is generated in the block write cycle in the above description, the timing at which sense amplifier activating signal S is generated is set before control signal *CAS falls in the normal write cycle in one bit, and it is necessary that memory cell data connected to word line WL is sensed and amplified before signal *CAS falls in the normal write cycle.

It is possible to easily increase or reduce the number of bits in which block write is performed by only adjusting the number of transfer gates included in each block selecting gate BSG in the block selecting circuit in accordance with the number of memory cells to be selected, i.e. the number of bit line pairs included in memory cell block MG.

Now, the structure of the control circuit for generating block selecting signal BS will be described with reference to FIG. 13.

Figure 1:
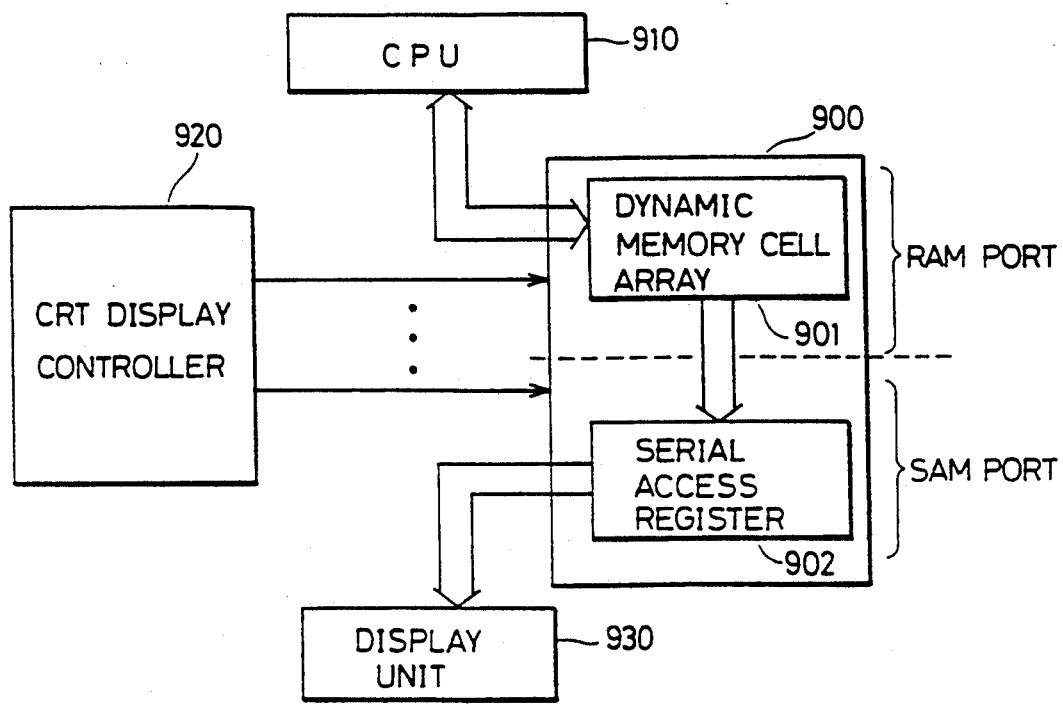
FIG. 1 is a schematic diagram illustrating a general structure of an image signal processing system.
Figure 13:
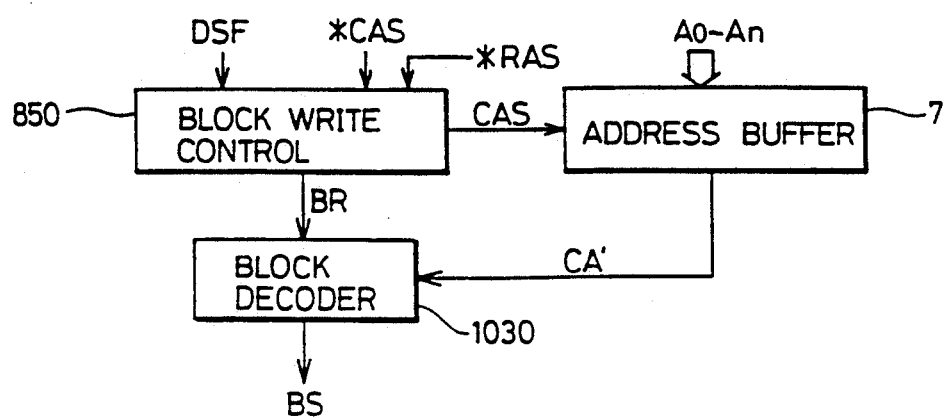
FIG. 13 is a block diagram illustrating a structure of block selecting signal generating circuitry in the semiconductor memory device according to an embodiment of the present invention.

FIG. 13 is a block diagram illustrating a structure of block write controlling circuitry. Block write controlling circuitry includes a block write controlling circuit 850 receiving control signals DSF, *RAS, and *CAS for generating an internal control signal CAS and a block decoder activating signal BR, an address buffer circuit 7 responsive to internal control signal CAS from block write controlling circuit 850 for accepting an external address A0 - An and generating an internal column address, and a block decoder 1030 for decoding an internal column address CA except for the least significant two bits, for example, from address buffer circuit 7 and generating a block selecting signal BS. Internal control signal CAS rises to "H" of an active state in response to the falling edge of external control signal *CAS. Block decoder activating signal BR is generated when control signal DSF is at "L" at the falling edge of control signal *RAS and is at "H" at the falling edge of control signal CAS. The structure of block write controlling circuit 850 can be implemented using a first latch circuit for latching and providing control signal DSF at the falling edge of control signal *RAS, a second latch circuit for strobing and latching control signal DSF at the falling edge of control signal *CAS, and a logic circuit for taking logical product of the inversion signal of the output of the first latch circuit and the output of the second latch circuit. When the output of the logic circuit is at "H", block decoder 1030 is activated.

While a case where a dual port RAM having two ports, a RAM port and a SAM port, is used as a semiconductor memory device has been described in the above embodiment, this structure is also applicable to a normal dynamic random access memory. Specifically, if a first latch circuit (which corresponds to the color register) responsive to an external control signal for latching data is provided separately from the input/output buffer, and a structure for storing and transferring the output of the latch circuit is provided for each memory cell array group, it is also possible to easily realize block write in a normal random access memory.

In addition, while inputting/outputting of data is performed in one bit through data input/output terminal 22 in the above embodiment, it is possible to obtain the same effect as that of the above embodiment even when it is performed in a plurality of bits if the above structure is provided for each bit. Furthermore, the data input/output terminal may have a structure in which a data input terminal and a data output terminal are provided separately.

As described above, according to the present invention, the path through which data writing is performed in the normal mode and the path through which data writing is performed in the block write mode are provided separately, so that it is unnecessary to use a complicated logic for changing the common data bus between in the block write mode and in the normal mode, and it is also unnecessary to provide a plurality of common data bus lines corresponding to the number of bits in which block write is performed, and it is possible to obtain a semiconductor memory device capable of easily extending the number of bits of block write with a small occupied area and a simple circuit configuration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
an input node for receiving data to be written;
a memory cell array including a plurality of memory cells arranged in a matrix of rows and columns, said memory cell array including a plurality of memory cell blocks each including a plurality of columns of memory cells in said matrix;
sense amplifiers provided for each respective column for detecting and amplifying signals on corresponding columns, said sense amplifiers having a first driving ability;
memory cell selecting means receiving an address signal and for selecting a memory cell corresponding to said received address signal in said memory cell array;
data writing means coupled to said input node for writing said data to be written into the memory cell selected by said memory selecting means;
block selecting means responsive to said address signal and a block write designation signal for selecting a memory block and a row in said memory cell array; and
block write means coupled to said input node and provided independently of said data writing means, and in response to said block write designating signal for writing said data to be written into memory cells on the row in the memory block selected by said block selecting means, said block write means having a second driving ability larger than the first driving ability in order to modify the signals amplified by said sense amplifiers in the selected memory block into signals corresponding to the data to be written;
data transferring path of said data writing means being different from data transferring path of said block write means.

2. A semiconductor memory device according to claim 1, wherein said block selecting means includes means for decoding said address signal and generating a block designating signal for indicating a corresponding memory block in said memory cell array, and wherein
said block write means includes gate means provided for each respective memory block and in response to said block designating signal for transferring said data to be written to an associated memory block.

3. A semiconductor memory device comprising:
an input node for receiving data to be written;
a memory cell array including a plurality of memory cells arranged in a matrix of rows and columns, said memory cell array including a plurality of memory cell blocks each including a plurality of columns of memory cells in said matrix;
sense amplifiers provided for each respective column for detecting and amplifying signals on corresponding columns, said sense amplifiers having a first driving ability;
memory cell selecting means receiving an address signal and for selecting a memory cell corresponding to said received address signal in said memory cell array;
data writing means coupled to said input node for writing said data to be written into the memory cell selected by said memory selecting means;
block selecting means responsive to said address signal and a block write designation signal for selecting a memory block and a row in said memory cell array; and
block write means coupled to said input node and provided independently of said data writing means, and in response to said block write designating signal for writing said data to be written into memory cells on the row in the memory block selected by said block selecting means, said block write means having a second driving ability larger than the first driving ability in order to modify the signals amplified by said sense amplifiers in the selected memory block into signals corresponding to the data to be written, wherein
data transferring path of said data writing means is different from data transferring path of said block write means,
said block selecting means includes means responsive to said block write designation signal for decoding said address signal and generating a block designating signal for indicating a corresponding memory block in said memory cell array, and
said block write means includes storage means provided corresponding to each respective memory block for storing said data to be written, and means provided corresponding to each respective memory block and, in response to said block designating signal, for transferring data stored in an associated storage means onto each respective column of an associated memory block.

4. A semiconductor memory device comprising:
an input node for receiving data to be written;
a memory cell array including a plurality of memory cells arranged in a matrix of rows and columns, said memory cell array including a plurality of memory cell blocks each including a plurality of columns of memory cells in said matrix;
sense amplifiers provided for each respective column for detecting and amplifying signals on corresponding columns, said sense amplifiers having a first driving ability;
memory cell selecting means receiving an address signal and for selecting a memory cell corresponding to said received address signal in said memory cell array;
data writing means coupled to said input node for writing said data to be written into the memory cell selected by said memory selecting means;
block selecting means responsive to said address signal and a block write designation signal for selecting a memory block and a row in said memory cell array; and
block write means coupled to said input node and provided independently of said data writing means, and in response to said block write designating signal for writing said data to be written into memory cells on the row in the memory block selected by said block selecting means, said block write means having a second driving ability larger than the first driving ability in order to modify the signals amplified by said sense amplifiers in the selected memory block into signals corresponding to the data to be written, wherein data transferring path of said data writing means is different from data transferring path of said block write means, said block selecting means includes means responsive to said block write designation signal for decoding said address signal and generating a block designating signal for indicating a memory block in said memory cell array, and said block write means includes first storage means coupled to said input node and responsive to a first block write designating signal for storing said data to be written;

second storage means provided corresponding to each respective memory block for storing data;

transfer gate means responsive to a transfer designating signal generated in response to said first block write designating signal, for transferring data stored in said first storage means to each respective second storage means for data storage therein; and block transfer means provided for each respective memory block and, in response to said block designating signal, for transferring data stored in a corresponding second storage means onto each respective column of a memory block selected by said block select signal.

5. A semiconductor memory device operable in a block write mode, said block write mode including generation of a first block write designating signal and a second block write designating signal, comprising:

a memory cell array including a plurality of memory cells arranged in a matrix of rows and columns, said memory cell array including a plurality of memory blocks each including a group of columns in said memory cell array;

sense amplifiers provided for each of said columns for detecting and amplifying signals transferred from associated memory cells on corresponding columns;

an input node for receiving data to be written into said memory cell array;

write data generation means coupled between said input node and a data bus and generating an internal write data signal corresponding to said data to be written onto said data bus;

column select means for selecting and coupling a column in said memory cell array according to a received address signal to said data bus;

storage means responsive to said first block write designating signal for latching said data to be written into said memory cell array received at said input node; and block select means provided separately from said column select means, and activated in response to said second block write designating signal for transferring data stored in said storage means onto each respective column of a memory block corresponding to said received address signal without going through said data bus, after activation of the sense amplifiers; wherein said storage means has a latching ability large enough to modify the signals amplified by the sense amplifiers in the memory block corresponding to said received address signal into signals corresponding to the latched data.

6. A semiconductor memory device according to claim 5, wherein said block select means includes decoder means for decoding said received address signal and generating a block select signal indicating a memory block corresponding to said received address signal, and connecting means provided for each respective memory block and in response to said block select signal for coupling said storage means to each respective column of a memory block selected by said block select signal.

7. A semiconductor memory device operable in a block write mode, said block write mode including generation of a first block write designating signal and a second block write designating signal, comprising:

a memory cell array including a plurality of memory cells arranged in a matrix of rows and columns, said memory cell array including a plurality of memory blocks each including a group of columns in said memory cell array;

sense amplifiers provided for each of said columns for detecting and amplifying signals transferred from associated memory cells on corresponding columns;

an input node for receiving data to be written into said memory cell array;

write data generation means coupled between said input node and a data bus and generating an internal write data signal corresponding to said data to be written onto said data bus;

column select means for selecting and coupling a column in said memory cell array according to a received address signal to said data bus;

storage means responsive to said first block write designating signal for latching said data to be written into said memory cell array receiving at said input node; and block select means provided separately from said column select means, and activated in response to said second block write designating signal for transferring data stored in said storage means onto each respective column of a memory block corresponding to said received address signal without going through said data bus, after activation of the sense amplifiers; wherein said storage means has a latching ability large enough to modify the signals amplified by the sense amplifiers in the memory block corresponding to said received address signal into signals corresponding to the latched data, and said storage means first storage means coupled to said input node and response to said first block write designating signal for storing data received at said input node;

second data storage means provided for each respective block, for storing data; and transfer means responsive to a transfer designating signal generated responsive to said first block write designating signal, for transferring data stored in said first data storage means to each said second data storage means for data storage therein.

8. A semiconductor memory device according to claim 7, wherein said block select means includes decoder means for decoding said received address signal and generating a block select signal indicating a memory block corresponding to that received address signal; and connecting means provided for each respective memory block and in response to said block select signal for coupling an associated second storage means to each respective column of a memory block selected by said block select signal.

9. A multiport memory device including a randomly accessible port and a serially accessible port, comprising:

a memory cell array including a plurality of dynamic type memory cells arranged in a matrix of rows and columns, said memory cell array including a plurality of memory blocks each including a group of columns of said matrix;

sense amplifiers provided for each of said columns for detecting and amplifying signals transferred from associated memory cells on corresponding columns;

RAM input node for receiving data to be written;

input buffer means coupled to said RAM input node and receiving data to be written therefrom for generating an internal data signal, corresponding to the received said data, onto a RAM data bus;

column select means for decoding a received address signal to generate a column select signal indicating a column in said matrix corresponding to said received address signal;

I/O gate means responsive to said column select signal for connecting a corresponding column in said matrix to said RAM data bus;

register means responsive to a load color cycle indicating signal for storing data received at said RAM input node;

storage means for receiving and latching data stored in said register means;

block select means responsive to a block write cycle indicating signal for decoding said received address signal to generate a block select signal indicating a memory block corresponding to said received address signal; and coupling means responsive to said block select signal for coupling said storage means to each respective column of a memory block corresponding to said block select signal without going through said RAM data bus, after activation of the sense amplifiers, wherein said storage means has a latching ability large enough to modify the signals amplified by the sense amplifiers in the memory block selected by the block select signal into signals corresponding to the latched data.

10. A semiconductor memory device according to claim 9, wherein said coupling means includes select gate means provided corresponding to each respective memory block, only one gate means made conductive in response to said block select signal.

11. A semiconductor memory device according to claim 9, wherein said storage means includes storage elements provided corresponding to respective memory blocks for storing data stored in said register means, and wherein said coupling means includes means responsive to said block select signal for coupling one of said storage element to each respective column of a memory block designated by said block select signal.

12. A semiconductor memory device according to claim 11, further comprising data transfer means responsive to a transfer control signal for transferring data stored in said register means to all said storage elements, said transfer control signal generated in response to said load color cycle designating signal.

13. A semiconductor memory device according to claim 9, further comprising data transfer means responsive to a transfer control signal for transferring data stored in said register means to said storage means, said transfer control signal generated responsive to said load color cycle designating signal.

14. In a semiconductor memory device including a memory cell array with a plurality of memory cells arranged in a matrix of rows and column, and sense amplifiers provided for each of said columns for detecting and amplifying signals transferred from associated memory cells on corresponding columns, a method of storing data comprising the steps of:

in a normal mode operation,
selecting a memory cell corresponding to a received first address signal, and
writing data into the selected memory cell through a data bus; and in a block write mode operation,
selecting a group of columns of said matrix corresponding to a received second address signal,
temporarily latching data to be written, and
transferring the latched data to be written to the selected group of columns without going through said data bus, wherein said step of temporarily latching is carried out with a latching ability large enough to modify signals amplified by the sense amplifiers in the groups of columns corresponding to the received second address signal into signals corresponding to the latched data.

* * * * *